(12) United States Patent
Wang

(10) Patent No.: US 9,767,905 B2
(45) Date of Patent: Sep. 19, 2017

(54) SCAN CHAIN CIRCUITS IN NON-VOLATILE MEMORY

(71) Applicant: SanDisk 3D LLC, Milpitas, CA (US)

(72) Inventor: Kesheng Wang, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 89 days.

(21) Appl. No.: 14/919,154

(22) Filed: Oct. 21, 2015

(65) Prior Publication Data

US 2017/0115342 A1   Apr. 27, 2017

(51) Int. Cl.
| | | |
|---|---|---|
| G01R 31/28 | (2006.01) | |
| G11C 16/04 | (2006.01) | |
| G11C 16/08 | (2006.01) | |
| G11C 16/32 | (2006.01) | |
| G11C 29/32 | (2006.01) | |
| G01R 31/3185 | (2006.01) | |

(52) U.S. Cl.
CPC .......... *G11C 16/0483* (2013.01); *G11C 16/08* (2013.01); *G11C 16/32* (2013.01); *G11C 29/32* (2013.01); *G01R 31/318536* (2013.01); *G11C 2211/5644* (2013.01); *G11C 2211/5646* (2013.01)

(58) Field of Classification Search
CPC ..... G11C 29/44; G11C 29/40; G11C 16/0483; G01R 31/3177; G01R 31/3127
See application file for complete search history.

(56) References Cited

U.S. PATENT DOCUMENTS

| | | | |
|---|---|---|---|
| 5,657,332 A | 8/1997 | Auclair et al. | |
| 5,905,680 A * | 5/1999 | Bosshart | G06F 12/0895 365/189.07 |
| 7,225,374 B2 | 5/2007 | Burdine et al. | |
| 8,266,485 B2 | 9/2012 | Liu et al. | |
| 8,427,884 B2 * | 4/2013 | Liu | G11C 29/40 365/185.18 |
| 8,681,548 B2 | 3/2014 | Liu et al. | |
| 8,811,085 B2 | 8/2014 | Sprouse et al. | |
| 8,830,745 B2 | 9/2014 | Mui et al. | |
| 8,842,473 B2 | 9/2014 | Tsai | |
| 8,897,080 B2 | 11/2014 | Tsai | |
| 9,076,506 B2 | 7/2015 | Tsai | |
| 2003/0036869 A1 * | 2/2003 | Huisman | G01R 31/31725 702/117 |

(Continued)

*Primary Examiner* — Guerrier Merant
(74) *Attorney, Agent, or Firm* — Vierra Magen Marcus LLP

(57) ABSTRACT

A bit scan circuit includes N scan blocks corresponding with an N-bit string of binary data. The string is scanned using an input clock signal to count the number of bits having a predetermined binary value. Each scan block includes a single latch to transfer the corresponding bit and to indicate reset. The scan blocks are organized into groups. Each group is enabled by a corresponding token signal. The token signal for each group is asserted after each preceding scan block indicates a pass value. When enabled by its token signal, the first scan block in a group is reset by a first clock signal. A second scan block in the group is enabled for reset after the first scan block indicates the pass value. The second scan block in the group is reset by a second clock signal having pulses that precede corresponding pulses from the first clock signal.

24 Claims, 11 Drawing Sheets

(56) References Cited

U.S. PATENT DOCUMENTS

| | | | |
|---|---|---|---|
| 2006/0236181 A1* | 10/2006 | Kiryu | G01B 31/318555 714/733 |
| 2012/0321032 A1* | 12/2012 | Liu | G11C 29/44 377/26 |
| 2013/0271197 A1* | 10/2013 | Sanghani | G01R 31/318552 327/225 |
| 2014/0126293 A1 | 5/2014 | Tsai et al. | |

* cited by examiner

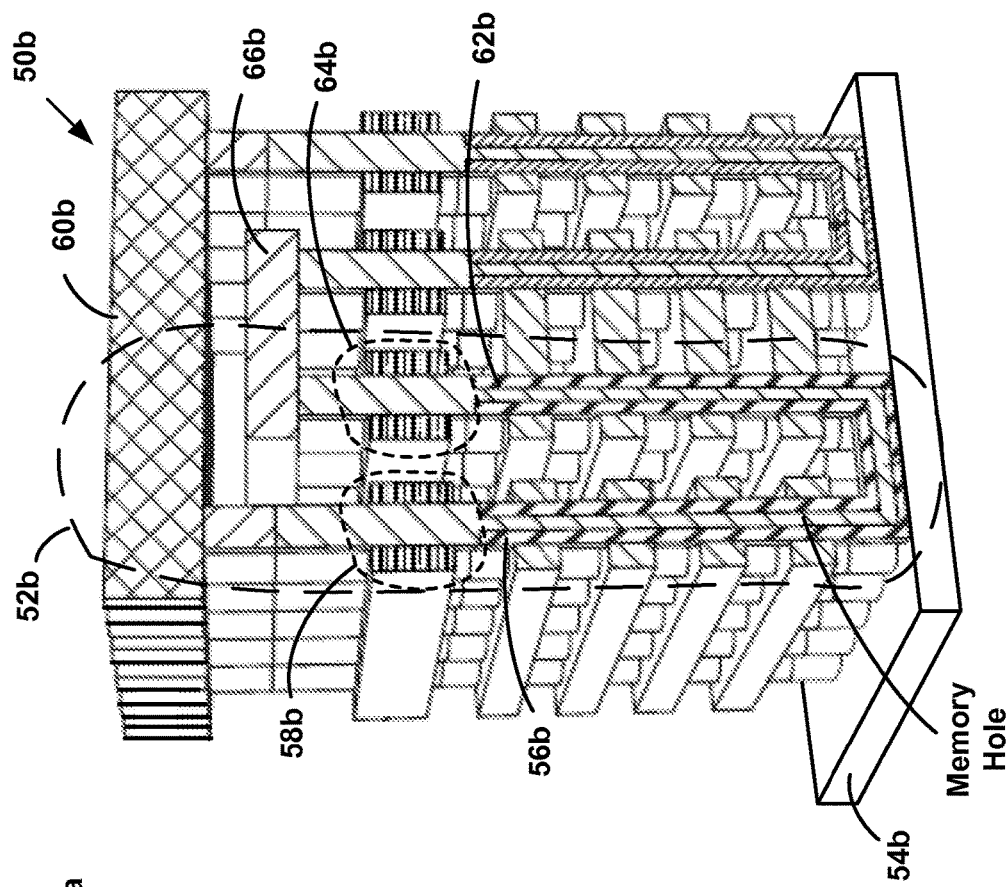
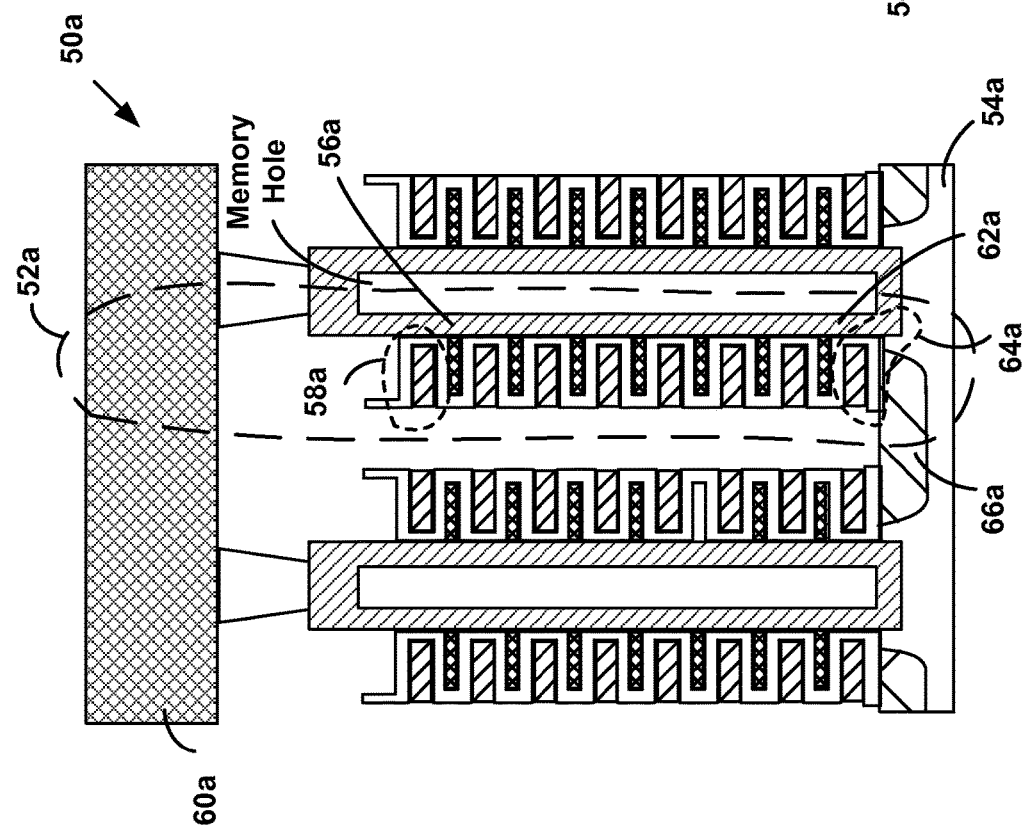

SCAN CHAIN CIRCUITS IN NON-VOLATILE MEMORY

BACKGROUND OF THE INVENTION

The present disclosure is directed to bit scan technology.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (VTH) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM is applied to the control gate during a program operation as a series of pulses that increase in magnitude over time. In one possible approach, the magnitude of the pulses is increased with each successive pulse by a predetermined step size, e.g., 0.2-0.4V. VPGM can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

When programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

There is often a need to count the number of logic '1's or '0's in an N-bit string. During a program operation, for example, a page of binary target data may be provided in a first set of data latches of the memory device. A page (e.g., N) of memory cells are then programmed in parallel according to the target data to allow the N memory cells to reach their respective target states. After programming of the page is done, the page of binary data is read back from the group of memory cells and stored in a second set of data latches. The binary data pages of the first and second sets of data latches can be compared to verify that the programming was performed correctly. Typically, an XOR operation is performed bit-by-bit between the two sets, and a '1' indicates a disagreement between the two sets. Thus, the result of the comparison is an N-bit string where any occurrence of '1's would indicate a memory cell that fails to program correctly. Of course, in a reverse logic implementation, '0's instead of '1's could indicate an incorrectly programmed memory cell.

If the number of failed bits exceeds a correction capability of a built-in error correction control (ECC) scheme, the programming may be repeated or re-done. However, in today's generation of flash memory, the data page is typically quite large, as for example, of the order of 10^5 bits. Existing circuits and methods to scan this string for occurrence of "1"s can be time and/or hardware intensive.

BRIEF DESCRIPTION OF THE DRAWINGS

FIGS. 12A-12B are cross-sectional and perspective views of three-dimensional NAND memory arrays.

DETAILED DESCRIPTION

Figure 1:
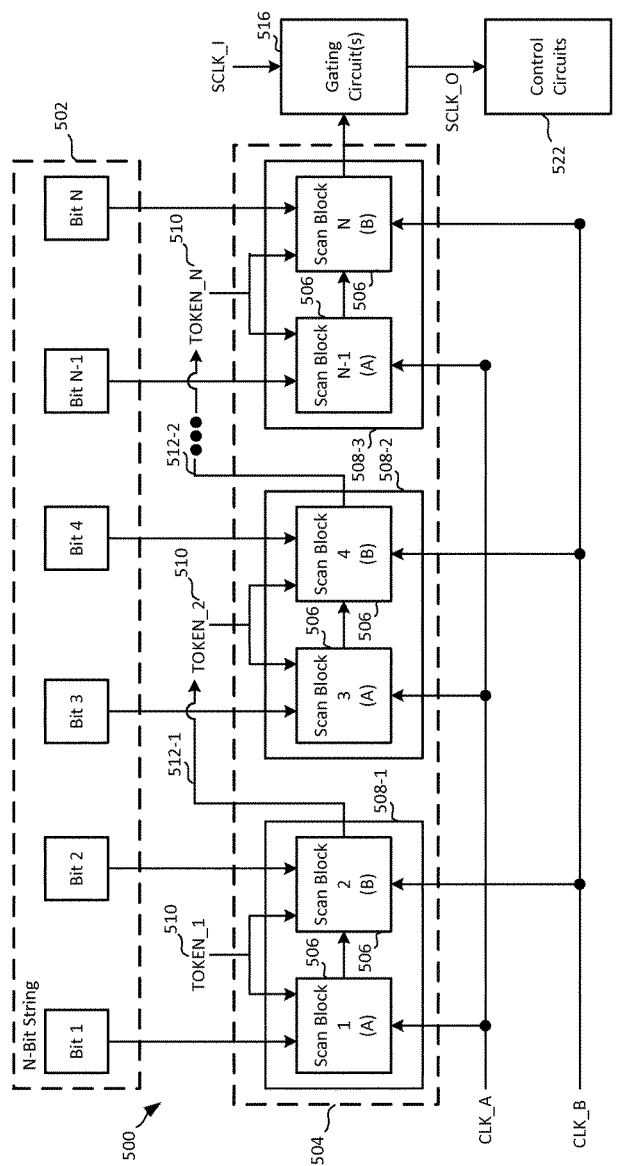
FIG. 1 is a block diagram of a bit scan circuit according to one embodiment.

Embodiments of the disclosed technology are directed to bit scan circuits that are configured to scan an N-bit string of binary data using an input clock signal to count the number of bits having a predetermined binary value. The bit scan circuit includes N scan blocks in a scan chain with each scan block corresponding to one bit of the N-bit string. Each scan block utilizes a single latch circuit to transfer the loaded bit information and for reset to indicate that the corresponding bit has been counted in the scan operation. The plurality of scan blocks are organized into scan block groups including two or more scan blocks. Each scan block group is enabled by a corresponding token signal. The token signal for each scan block group is asserted after each preceding scan block stores a pass value. When enabled by the corresponding token signal, the first scan block in a scan block group is reset in response to a first clock signal. A second scan block in the group is enabled for reset after the first scan block in the group is reset. The second scan block in the group is reset in response to a second clock signal having pulses that precede corresponding pulses from the first clock signal.

The latch circuit of each scan block has a tag bit that controls the latch circuit to be either in a "no-pass" or "pass" state. For example, the predetermined binary value may correspond to the no-pass state. The tag bits of each scan block are initially set according to the bits of the N-bit string. An input clock signal is provided as a first input to one or more gating circuits and an output of the bit scan circuit is provided as a second input to the gating circuit(s). When the tag bit of any of the scan blocks is a no-pass value, the output of the bit scan circuit is driven to a first value causing the input clock signal to be gated or otherwise blocked. When the tag bit is a pass value, the output of the bit scan circuit is driven to a second value causing the input clock signal to be passed in an output clock signal. After the tag bit is counted in the scan operation, it is reset to the pass value so that it does not affect subsequent input clock pulses. When all of the no-pass latch circuits have been reset, the number of bits having the predetermined binary value is given by the number of pulses missing from the output clock signal as compared with the input clock signal.

The token signal for each scan block group is asserted when the tag bits for each preceding scan block in the chain are reset to the pass state. In one embodiment, the first scan block group in the chain is enabled at the beginning of a scan operation by asserting the token signal for the first scan block group. Each remaining scan block group is connected to a corresponding one of a plurality of token latches. Each token latch asserts the token signal for the corresponding scan block group when the tag bits for each preceding scan block are set to the pass value.

The first scan block of each scan block group resets its tag bit from the no-pass value to the pass value in response to a first clock signal pulse. The first scan block will generate an output signal including the first binary value to enable the second scan block of the scan block group for reset during the next second clock signal pulse. The second scan block of each scan block group resets its tag bit from the no-pass value to the pass value in response to the leading edge of a pulse from the second clock signal if the tag bit of the first scan block of the scan block group is the pass value. By contrast, the second scan block of the scan block group will maintain the tag bit at the no-pass value in response to a second clock signal pulse if the tag bit of the first scan block of the scan block group is the no-pass value. By utilizing a first clock signal with pulses that come after the corresponding pulses from the second clock signal, a single data latch can be used for each scan block while correctly counting the number of bits with the predetermined binary value over two clock cycles if needed.

FIG. 1 is a simplified block diagram including a bit scan circuit according to one embodiment of the disclosed technology. An input clock signal is gated using a scan chain (also referred to as a shooting chain) to scan the binary data from an N-bit string. For example, the bit scan circuit may scan the number of logic "1"s and/or "0"s in the N-bit string. The bit scan circuit includes a plurality of scan blocks, each having a single latch circuit. The scan blocks are organized into groups with the individual scan blocks of a group using independent clock signals.

The bit scan circuit 500 selectively gates an input clock signal SCLK_I according to a tag bit stored by a latch circuit for each scan block 506. Various clock means may be used to generate the input clock signal, including hardware or software-based clock means. The input clock signal may be produced by a clock generator in one embodiment. In another embodiment, the input clock signal may be produced by one or more oscillators. The bit scan circuit includes a scan chain 504 or shooting chain including N scan blocks 506 corresponding to the N-bits of the N-bit string. Scan chain 504 includes scan block 1, scan block 2, scan block 3, scan block 4, scan block N−1 and scan block N. The scan block at the beginning of the scan chain has the highest priority and the scan block at the end of the scan chain has the lowest priority. A scan chain may include any number of scan blocks.

A scan block includes circuitry for latching one bit from the N-bit string and providing an indication when the bit has been considered in a scan operation. Each scan block 506 acts as a gating signal for the input clock signal SCLK_I. The transmission property of the gating signal is controlled by a tag bit. A tag bit provides a no-pass value or a pass value. The tag bit stores the bit latched from the N-bit string, and is reset after being considered in the scan operation. In one example, a coding of the tag bit establishes the no-pass value as logic '1' and the pass value as logic '0'. When the tag bit of an enabled scan block is the no-pass value, the gating signal will effectively block the input clock signal. One or more gating circuits 516 will gate or otherwise disable the input clock signal so that output clock signal SCLK_O does not contain a pulse corresponding to the input clock signal. When the tag bit of an enabled scan block is the pass value, the gating circuit 516 will allow the input clock signal SCLK_I to pass, generating the output clock signal SCLK_O with a pulse corresponding to the input clock signal pulse. The output of the gating circuit 516 can be fed to one or more control circuits 522 to count the number of pulses in or missing from the output clock signal relative to the input clock signal. Various control means including software and hardware-based control means may be used in accordance with one or more embodiments. The control means include control circuits 522 in one embodiment. The control circuits 522 may include a counter in one embodiment to count the number of pulses. In another embodiment, control circuits 522 may include a processor or logic circuitry to count the number of pulses.

The scan blocks are organized into scan block groups including two or more scan blocks for each group. A scan block group is a grouping of two or more scan blocks that are coupled to different clock signals. A scan block group is enabled by a token signal when each preceding scan block in the chain is at the pass value. In the example of FIG. 1, the N scan blocks are divided into a first subset A of scan blocks that are coupled to a first clock signal CLK_A and a second subset B of scan blocks that are coupled to a second clock signal CLK_B. Various clock means may be used to generate the first and second clock signals, including hardware or software-based clock means. The first and second clock signals may be produced by one or more clock generator circuits in one embodiment. In another embodiment, the first and second clock signals may be produced by one or more oscillator circuits. Each scan block group includes one scan block from the first subset and one scan block from the second subset. For example, scan block group 508-1 includes scan block 1 from a first subset A of scan blocks and scan block 2 from a second subset B of scan blocks. Various scan means may be used to scan and transfer one or more bits from an N-bit string. In one embodiment, each scan means includes a scan block group having two data latches to scan and transfer two loaded bits from the N-bit string. In another embodiment, each scan block group may include logic gates to scan and transfer the two loaded bits. It is noted that the plurality of scan blocks may be divided into additional subsets of scan blocks that are coupled to additional clock signals such that each scan block group includes more than two scan blocks.

Each scan block of a scan block group includes a third input coupled to a token signal. The token signal is asserted to enable the corresponding scan block group. When enabled, each scan block in the scan block group is responsive to the corresponding clock signal to which it is coupled. The first scan block group in the scan chain is coupled to a token signal TOKEN_1 that is enabled at the beginning of the scan operation. The remaining scan block groups are each coupled to a corresponding token latch. A token latch is a data latch associated with a scan block group that asserts the token signal for the corresponding scan block group when the tag bit for each preceding scan block is the pass value. The token latch may be used to select or enable a corresponding scan block group and may be referred to as a select latch.

Within scan chain 504, the output of the first scan block in each group is coupled to the output of the second scan block in the group to only enable the second scan block for reset when the first scan block is in the pass state. Moreover, the shooting chain is established by coupling the output of the last scan block in each group (except for the final group) to a circuit for asserting the token signal for the next scan block group in the chain. For example, the output of scan block 2 from the first group can be provided as a latch enable signal 512-1 to a token latch for generating the signal TOKEN_2 associated with the second scan block group. The output of scan block 4 from the second group can be output as a latch enable signal 512-2 to a token latch for generating the signal TOKEN_3. The token signal for each scan block group enables each scan block within the group for reset during a next clock cycle. The output of the second scan block of each scan block group is coupled to the token latch for the next scan block group in the shooting chain. The output is configured so that the token signal is only asserted to enable the corresponding scan block group when the tag bits of the scan blocks for the preceding scan block groups are set or reset to the pass value.

The one or more control circuits 522 control the operations of the scan bit circuit 500. The control circuits can issue a reset control signal, causing the latch circuits of each scan block to be reset to a default value which corresponds to the pass value in one example. The control circuits may issue a load control signal load causing the N-bits of the N-bit string 502 to be loaded as loaded bits into the respective latch circuits of the N scan blocks in the scan chain 504. The tag bit in each latch is initially set to the value of the loaded bit. For example, where the loaded bit is logic '0', the tag bit is set to logic '0' setting the latch circuit to the pass state. Where the loaded bit is logic '1', the tag bit is set to logic '1' setting the latch circuit to the no-pass state.

Control circuits 522 may begin a scan operation for the number of logic '1's in the N-bit string indicating a no-pass state for example. The control circuits 522 input the input clock signal SCLK_I as a pulse train into gating circuit 516 while inputting the first clock signal CLK_A and the second clock signal CLK_B to the inputs of the first and second subsets of scan blocks.

The first scan block group 508-1 in the scan chain 504 is enabled at the beginning of the scan operation by the assertion of the first token signal TOKEN_1. If both data latches for scan block 1 and scan block 2 are initially in a pass state, then the output of scan block 2 enables a token latch for the second scan block group 508-2. In response, the token latch asserts the signal TOKEN_2 for the second scan block group 508-2 to enable the second scan block group. Similarly, if both latches for scan block 3 and scan block 4 are in a pass state, the output of scan block 4 will enable a token latch for the following scan block group. This process is repeated down the shooting chain.

If, however, the latch circuit of any scan block is in a no-pass state then the shooting chain is interrupted causing the input clock signal 518 to be gated or otherwise disabled. During each of the input clock signal pulses SCLK_I, if any one of the scan blocks has a tag bit with the no-pass value then the output of the final scan block in the scan chain will cause the input clock signal to be gated. Once the tag bits for all scan blocks for all scan block groups in the scan chain are the pass value, the output of the final scan block of the scan chain will generate an output signal causing gating circuit 516 to pass the input clock signal.

Figure 2:
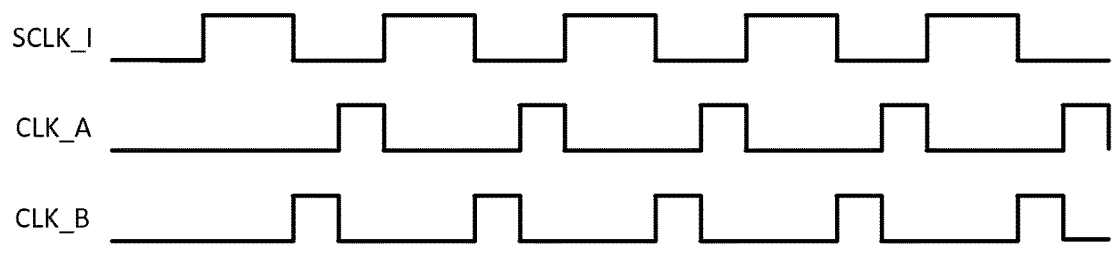
FIG. 2 is a timing diagram for the bit scan circuit of FIG. 1 according to one embodiment.

FIG. 2 is a timing diagram illustrating the input clock signal SCLK_I, the first clock signal CLK_A, and the second clock signal CLK_B as described in FIG. 1. The input clock signal SCLK_I includes a pulse train having a plurality of pulses, each having a first pulse width 'w'. The first clock signal CLK_A includes a pulse train having a plurality of pulses, each having a second pulse width that is half ('w/2') that of the input clock signal. A second clock signal CLK_B also includes a pulse train having a plurality of pulses with the second pulse width. Corresponding pulses from the first clock signal and the second clock signal are provided between the input clock signal pulses. Each pulse of the second clock signal precedes a corresponding pulse from the first clock signal. For example, the first pulse from the second clock signal has a falling edge that corresponds with a rising or leading edge of the first pulse of the first clock signal. The falling edge of the input clock signal pulse corresponds with a rising edge of a pulse from the second clock signal and a rising edge of the next input clock signal pulse corresponds with a falling edge of the next first clock signal pulse.

As described above, each scan block in FIG. 1 includes a single data latch to perform the scan operation. The input clock signal is passed directly to a gating circuit and two clock signals, CLK_A and CLK_B, are used to reset the scan blocks. The scan blocks are organized into scan block groups including one scan block coupled to the first clock signal and one scan block coupled to the second clock signal. The first scan block precedes the second scan block in each scan block group while the second clock signal precedes the first clock signal. The second scan block is only enabled when the first scan block is set to the pass value. In this manner, a correct error account can be made over two clock cycles when needed and while utilizing a single data latch for each scan block. The data latch is used to load the bit information from the N-bit string and is then reset after its consideration to also serve the function of a reset bit. A token signal is used for each scan block group so that a scan block group is only enabled after each preceding scan block group has been considered in the scan operation.

Figure 3:
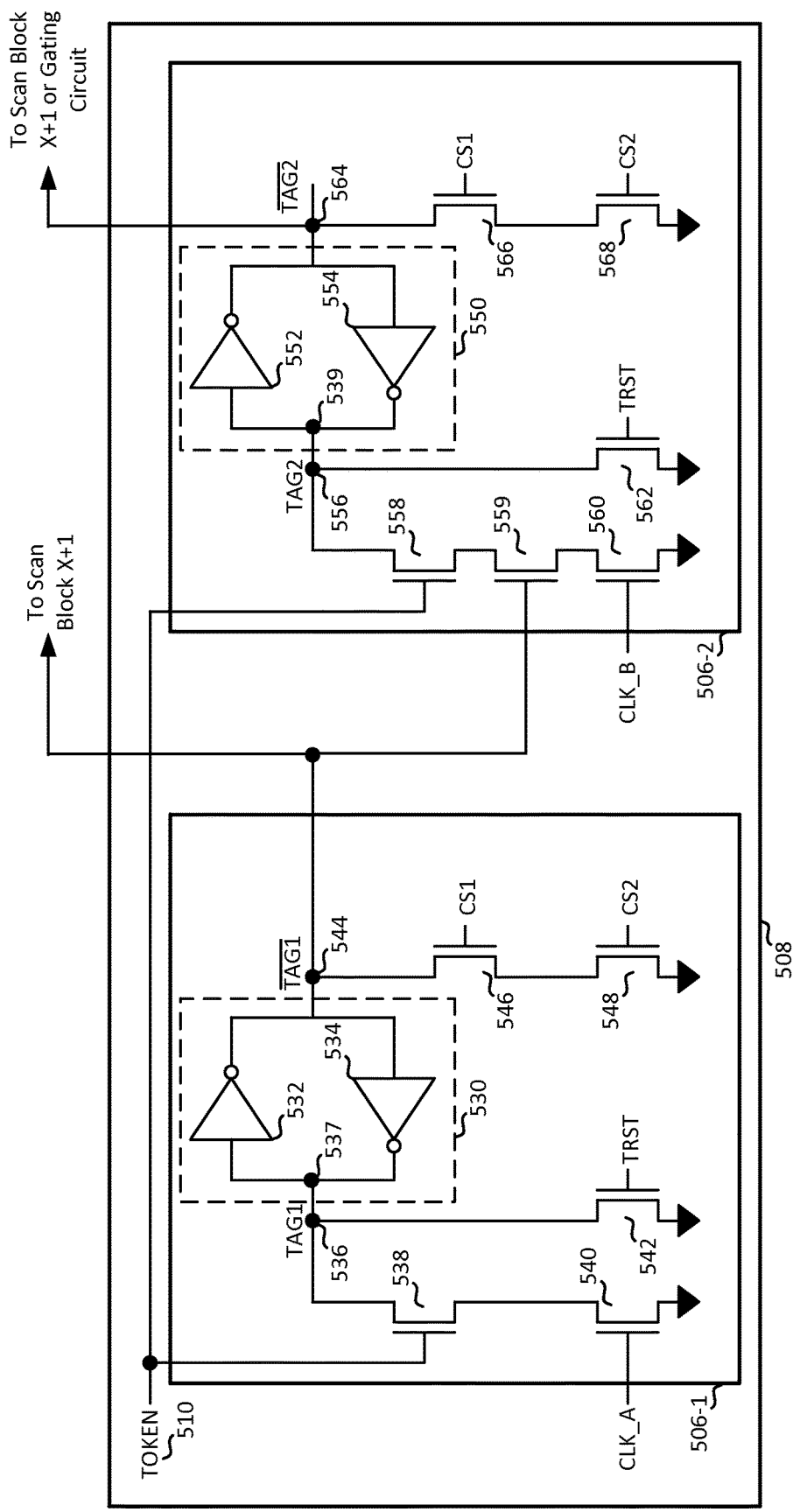
FIG. 3 is a circuit diagram depicting a scan block group according to one embodiment.

FIG. 3 is a circuit diagram depicting a more detailed view of a scan block group 508 in accordance with one embodiment of the disclosed technology. Scan block group 508 includes a first scan block 506-1 that receives the first clock signal CLK_A at the gate of transistor 540 and a second scan block 506-2 that receives the second clock signal CLK_B at the gate of transistor 560. As shown in FIG. 2, each of the pulses of clock signal CLK_B precedes a corresponding pulse from the first clock signal CLK_A.

Both scan blocks in the scan block group are selectively enabled by a token signal 510 for transfer of loaded bit information and reset. Token signal 510 may be generated by a constant supply voltage to enable the token signal at the beginning of a scan operation as with the first scan block group 508-1 shown in FIG. 1, or may be generated by a token latch in response to the output of a preceding scan block group as with scan block groups 508-2 and 508-3.

Before a scan operation, the scan blocks are reset by setting the tag bit for latch circuit 530 and the tag bit for latch circuit 550 to the pass value (e.g., logic "0"). Reset transistors 542 and 562 have their gates coupled to control signal TRST and their second nodes coupled to ground. When TRST is driven high, the input nodes 536 and 556 of scan block 506-1 and scan block 506-2 are pulled to ground, pulling the latch signals TAG1 and TAG2 low which are then latched in latches 530 and 550 as logic '0' for the corresponding tag bits 537 and 539.

The tag bits 537 and 539 in latches 530 and 550 are initially set to the values of the loaded bits. With respect to scan block 506-1 for example, transistor 546 is enabled by asserting a control signal CS1. Control signal CS2 carries a value based on the loaded bit. When the loaded bit is logic '0', CS2 is driven low disabling transistor 548. With the path to ground interrupted, signal $\overline{TAG1}$ is driven high. Latch circuit 530 is formed of two inverters 532 and 534 such that TAG1 is driven low, latching logic '0' in latch circuit 530 as the tag bit 537 for scan block 506-1. When the loaded bit is logic '1', CS2 is driven high providing a path to ground from node 544. The signal $\overline{TAG1}$ goes low, driving TAG high. Logic '1' is latched in latch circuit 530 as the tag bit 537. The same process occurs in scan block 506-2 using transistors 566 and 568 to latch the loaded bit in latch 550 as tag bit 539.

During scanning, scan blocks 506-1 and 506-2 are enabled for transfer of their tag bits for selectively gating of the input clock signal when the token signal is driven high. Data latch 530 provides the signal TAG1 at node 536 and the signal $\overline{TAG1}$ at node 544 based on the previously latched bit 537. When $\overline{TAG1}$ is low, the output from node 544 interrupts the scan chain or otherwise causes the input clock signal to be gated. The signal $\overline{TAG1}$ is provided at the output node to the next scan block X+1 in the chain. When $\overline{TAG1}$ is low, the subsequent scan block X+1 is disabled causing the input clock signal to be gated.

For scan block 506-2, data latch 550 provides the signal TAG2 at node 556 and the signal $\overline{TAG2}$ at node 564 based on the previously latched bit 539. As with scan block 506-1, when $\overline{TAG2}$ is low, the output from node 564 interrupts the scan chain or otherwise causes the input clock signal to be gated. As shown in FIG. 3, the output is provided to the next scan block X+1 in the chain. When $\overline{TAG2}$ is low, the subsequent scan block X+1 is disabled causing the input clock signal to be gated. If scan block 506-2 is part of the final scan block in the chain, the signal $\overline{TAG2}$ is provided to the gating circuits directly to cause gating of the input clock signal when the signal $\overline{TAG2}$ is low.

Reset of scan block 506-1 and the loaded bit information is controlled by the clock signal CLK_A. After the value of the tag bit 537 is used to connect or interrupt the scan chain path, the value at node 536 is reset during the following pulse of CLK_A. In this manner, the value of the tag bit in latch 530 is used to selectively gate an input clock signal pulse, and is then reset by the following pulse of the first clock signal CLK_A. When the scan block group is enabled by the token signal, latch 530 is reset when the clock signal CLK_A is driven high. The loaded bit information at node 536 is reset by the leading edge of a pulse from clock signal CLK_A. Thus, when the tag bit 537 is logic '1', it will be reset to logic '0' indicating the pass state in response to the leading edge of clock signal CLK_A. When token signal 510 is asserted, transistor 538 is on. Transistor 540 is turned on by a pulse of clock signal CLK_A. With transistors 538 and 540 on, a path to ground is provided from node 536, pulling the signal TAG1 low which is latched in latch 530 as logic '0.'

Reset of scan block 506-2 and the loaded bit information is controlled by the clock signal CLK_B. When the tag bit 537 for latch 506-1 is loaded or reset to logic '0,' the signal $\overline{TAG1}$ is driven high to enable the second scan block for reset during the next pulse of the clock signal CLK_B. Scan block 506-1 and scan block 506-2 are coupled together as a chain with the signal $\overline{TAG1}$ at the output node 544 of scan block 506-1 driving transistor 559 at the input node 561 of scan block 506-2. When $\overline{TAG1}$ is driven high, transistor 559 turns on to enable scan block 506-2 for reset during the next pulse of the second clock signal CLK_B. When the scan block group is enabled by the token signal and $\overline{TAG1}$ is driven high, latch 550 is reset when the clock signal CLK_B is driven high. The loaded bit information at node 556 is reset by the leading edge of a pulse from clock signal CLK_B. Thus, when the tag bit 539 is logic '1', it will be reset to logic '0' indicating the pass state in response to the leading edge of clock signal CLK_B. When token signal 510 is asserted, transistor 538 is on. Transistor 559 turns on in response to $\overline{TAG1}$ going high. Transistor 560 turns on by a pulse of clock signal CLK_B. With transistors 558, 559, and 560 on, a path to ground is provided from node 556, pulling the signal TAG1 low which is stored in latch 550 as logic '0.'

When $\overline{TAG1}$ and $\overline{TAG2}$ are high for scan blocks 506-1 and 506-2, the subsequent scan block X+1 is enabled and gating of the input clock signal will be determined by scan block X+1.

The aforementioned arrangement with the feature of the pulses of CLK_B preceding those of the CLK_A enable the tag bits of both latches 530 to be used in selectively gating the input clock signal without additional bits within scan block 506-1 and 506-2 for reset. Consider the situation when both scan block 506-1 and scan block 506-2 contain a "no-pass" tag bit (e.g., logic '1'). When group 508-1 is enabled by token signal 510, $\overline{TAG1}$ will be low. During the input clock signal SCLK_I pulse, $\overline{TAG1}$ will disable the next scan block group or scan block in the same group to gate input clock signal. The next pulse of CLK_B follows the input clock signal SCLK_I pulse prior to the next pulse of CLK_A. During the CLK_B pulse, $\overline{TAG1}$ is low which disables scan block 506-2 from reset. Accordingly, the tag bit at latch 550 remains at logic '1'. The next pulse of CLK_A follows the pulse of CLK_B. This pulse will reset the tag bit 537 at latch 530 to logic '0' which will drive $\overline{TAG1}$ high. During the next input clock signal SCLK_I pulse, $\overline{TAG2}$ will either disable the next scan block group or gate the input clock signal directly. The next pulse of CLK_B then follows the input clock signal SCLK_I pulse. During this CLK_B pulse, $\overline{TAG1}$ is high which enables scan block 506-2 for reset. Accordingly, the tag bit 539 at latch 550 is reset to logic '0'. As illustrated, both bits from latches 530 and 550 are used to gate the input clock signal twice while only using a single latch for each scan block.

Figure 4:
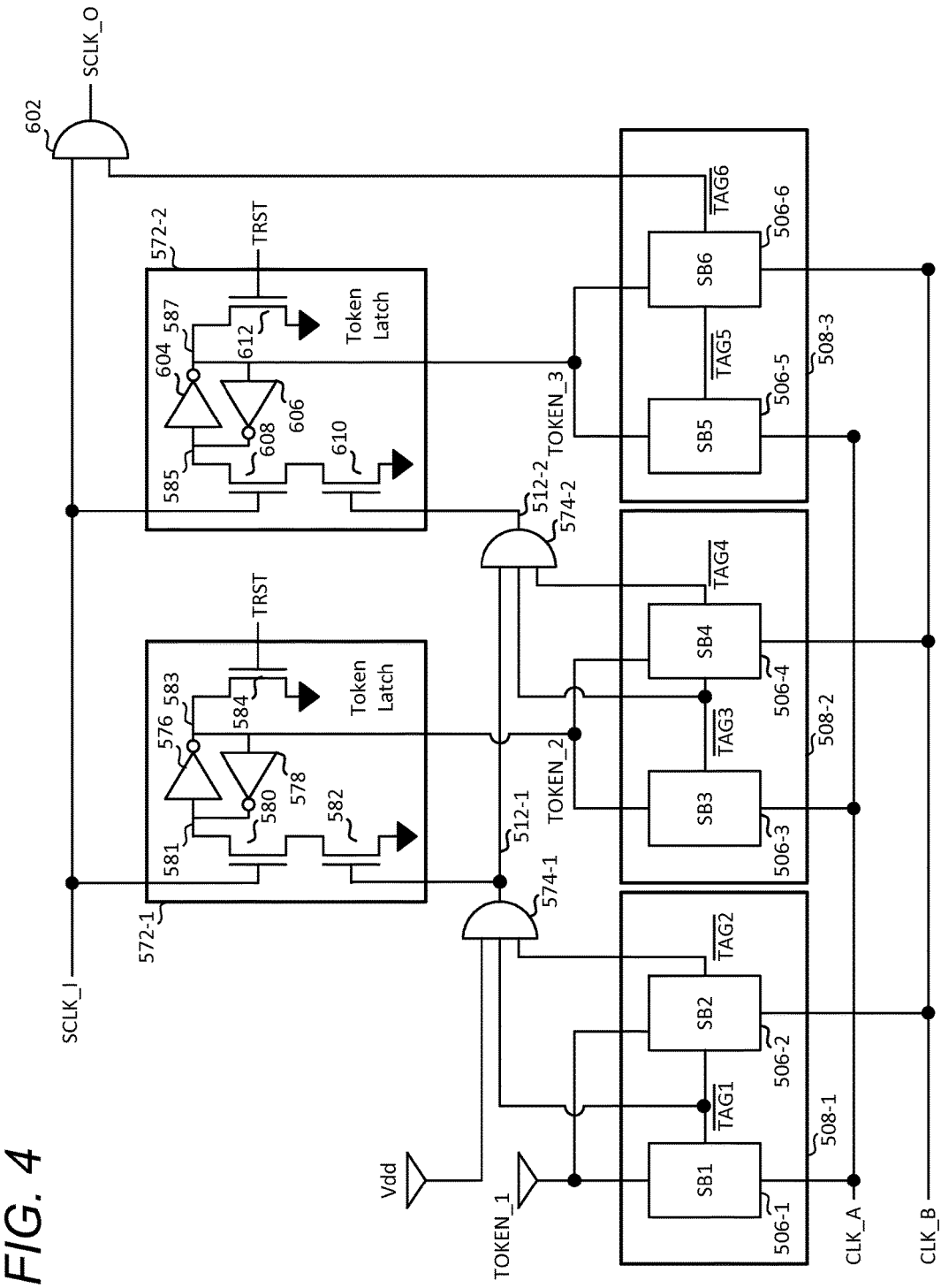
FIG. 4 is a block diagram including a detailed view of the token latches for a bit scan circuit according to one embodiment.

FIG. 4 is a block diagram depicting more detail of bit scan circuit 502 in accordance with one embodiment. Continuing with the example of FIG. 3, three scan block groups each comprising two scan blocks are illustrated.

A first subset of scan blocks 506-1, 506-3 and 506-5 are coupled to a first clock signal CLK_A. A second subset of scan blocks 506-2, 506-4 and 506-6 are coupled to a second clock signal CLK_B. The input clock signal SCLK_I is connected to the first input of AND gate 602 and the second input of AND gate 602 is coupled to the output of the final scan block 506-6 to form a gating circuit. Various gate mans may be used to gate or otherwise disable the input clock signal. The AND gate 602 forms a gate means for selectively gating the input clock signal in one embodiment. In another embodiment, an OR gate or one or more other logic gates may be used, while adjusting the outputs of SCLK_I and $\overline{TAG6}$ accordingly.

Each scan block group is enabled by a corresponding token signal as earlier described. In this example, the first scan block group 508-1 is enabled at the beginning of a scan operation by token signal TOKEN_1. The second scan block group 508-2 is enabled by control signal TOKEN_2, and the third scan block group 508-3 is enabled by a control signal TOKEN_3. The second scan block group 508-2 is coupled to a token latch 572-1 which generates token signal TOKEN_2 and the third scan block 508-3 is coupled to a token latch 572-2 which generates token signal TOKEN_3. During the reset before scanning, control signal TRST is asserted to drain output nodes 583 and 587 to ground and thereby reset the token latch values.

Token latch 572-1 is enabled when both scan blocks of scan block group 508-1 have tag bits in the pass state and token latch 572-2 is enabled when both scan blocks of scan block group 508-2 have tag bits in the pass state. Token latch 572-1 is coupled to the output of a first AND gate 574-1 to receive latch enable signal 512-1 and token latch 572-2 is coupled to the output of a second AND gate 574-2 to receive latch enable signal 512-2. The first AND gate 574-1 is controlled by the outputs of scan block group 508-1 and token latch 572-2 is controlled by the outputs of scan block group 508-2. Various logic means may be used for enabling the token latches. In one embodiment, the logic means includes an AND gate for each token latch, such as AND gate 574-1 which forms logic for enabling token latch 572-1. In another embodiment, an OR gate or one or more other logic gates may be used, while adjusting the outputs of Vdd, $\overline{TAG1}$, and $\overline{TAG2}$ accordingly.

The first AND gate 574-1 includes three inputs to receive a supply voltage (e.g., Vdd), the output $\overline{TAG1}$ from scan block 506-1, and the output $\overline{TAG2}$ from scan block 506-2. The output of AND gate 574-1 is driven low if any of the inputs are low. In this manner AND gate 574-1 is only driven high when $\overline{TAG1}$ and $\overline{TAG2}$ are both driven high to indicate that scan blocks 506-1 and 506-2 have tag bits at the pass value.

When the output of AND gate 574-1 is driven high, transistor 582 in token latch 572-1 turns on. When the input clock signal SCLK_I goes high turning transistor 580 on, the voltage at node 581 is drained to ground. This sets node 583 high through inverters 576 and 578. When node 583 is driven high, token signal TOKEN_2 is asserted to enable scan block group 508-2. Various latch means may be used for latching the output of the logic means and enabling a corresponding scan block group. In one embodiment, token latch 572-1 includes two inverters as shown to form a latching circuit. In another embodiment, the latch for token latch 572-1 may be formed using one or more flip flops.

The second AND gate 574-2 includes three inputs to receive the output of the first AND gate 574-1, the output signal $\overline{TAG3}$ from scan block 506-3, and the output signal $\overline{TAG4}$ from scan block 506-4. In this configuration, AND gate 574-2 is driven high when $\overline{TAG1}$, $\overline{TAG2}$, $\overline{TAG3}$, and $\overline{TAG4}$ are all driven high. Therefore, the output only goes high when the tag bits for all preceding scan blocks in the group are the pass value. The second AND gate forms the logic means for enabling token latch 572-2 in one embodiment. In another embodiment, an OR gate or one or more other logic gates may be used, while adjusting the outputs of Vdd, $\overline{TAG3}$, and $\overline{TAG4}$ accordingly. When the output of AND gate 574-2 is driven high, transistor 610 in token latch 572-2 turns on. When the input clock signal SCLK_I goes high turning transistor 608 on, the voltage at node 585 is drained to ground. This sets node 587 high through inverters 604 and 606. When node 587 is driven high, token signal TOKEN_3 is asserted to enable scan block group 508-3. Various latch means may be used for token latch 572-2. In one embodiment, token latch 572-2 includes two inverters as shown to form a latching circuit. In another embodiment, the latch for token latch 572-2 may be formed using one or more flip flops.

Figure 5:
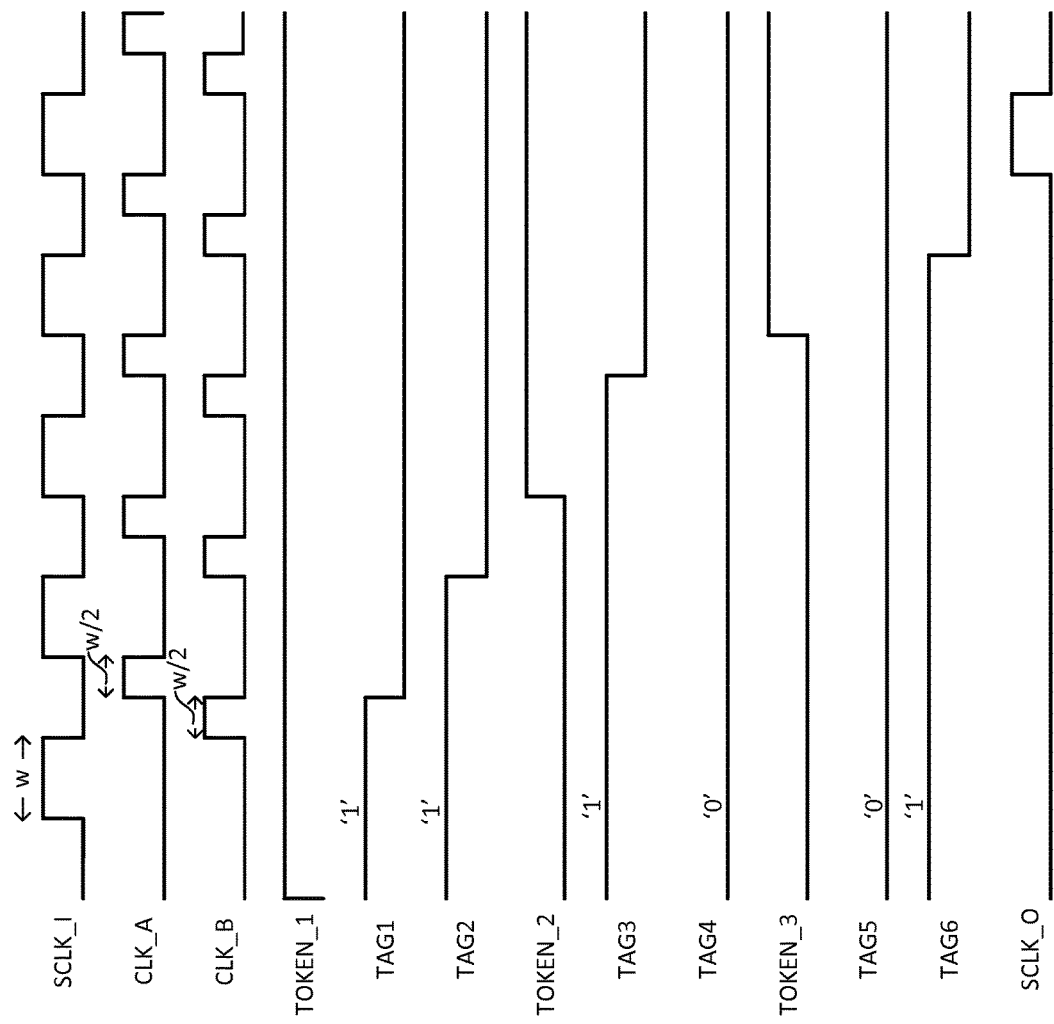
FIG. 5 is a timing diagram depicting an example of scanning a string of binary data to determine a number of bits having a predetermined binary value.

FIG. 5 is a timing diagram illustrating various signals of the bit scan circuit 500 from FIG. 4 in accordance with one embodiment. FIG. 5 continues with an example of a scan chain including three scan block groups, each having two scan blocks connected to independent clock signals CLK_A and CLK_B. The input clock signal SCLK_I includes a plurality of pulses having a pulse width 'w'. The clock signal pulses of CLK_A and CLK_B are asserted between each of the input clock pulses. Second clock signal CLK_B includes a pulse train with each pulse having a leading edge that corresponds with a falling edge of an input clock signal pulse. Each pulse has a pulse width of w/2 but different size pulse widths may be used. The first clock signal CLK_A includes a pulse train with each pulse having a leading edge that corresponds with a falling edge of a preceding pulse of the second clock signal CLK_B. The falling edge of each CLK_A pulse corresponds with a leading edge of a subsequent input clock signal pulse.

To illustrate functioning of the scan chain, a specific example is presented for an N-bit string having binary values of "111001." The N-bit string is loaded and latched into a set of a scan blocks as an initial set of loaded bit data shown in FIG. 5. The loaded data sets the initial state of the tag bits controlling the various TAG signals. With reference to FIG. 4, the scan chain is loaded with the N-bit string which is latched into the respective latches, thereby setting TAG1 at scan chain 506-1 to logic 1 TAG2 at scan block 506-2 to logic 1 TAG3 at scan block 506-3 to logic 1, TAG4 at scan block 506-4 to logic '0', TAG5 at scan block 506-5 to logic '0', and TAG6 at scan block 506-6 to logic '1'. If a tag bit is logic '1', the corresponding tag signal is driven high and the input clock signal is gated, thereby removing or disabling a pulse from the output clock signal SCLK_O. If a tag bit is logic '0', the corresponding tag signal is driven low and the input clock signal is not gated. The gating circuits will generate an output clock signal SCLK_O having a first pulse corresponding to the input clock signal.

Control signal TOKEN_1 is driven high at the beginning of the scan operation to enable the first scan block group. After driving TOKEN_1 high to enable scan blocks 506-1 and 506-2, the first input clock signal pulse SCLK_I is provided to the gating circuits and the inputs of the token latches as shown in FIG. 4. With the first scan block group enabled, the first pulse of the input clock signal is subjected to gating according to the tag bit of scan block 506-1.

In FIG. 5, the first pulse of the input clock signal SCLK_I pulse is gated according to TAG1 for scan block 506-1. When TAG1 is high, $\overline{TAG1}$ is driven low disabling the first AND gate and thereby interrupting the scan chain. The final scan block group 508-3 is not enabled by control signal TOKEN_3. Therefore, the output of the final scan block 506-6 is driven low. Accordingly, AND gate 602 will be driven low gating the input clock signal pulse. Therefore the output clock signal SCLK_O does not contain a pulse corresponding to the first pulse of the input clock signal SCLK_I.

The falling edge of the first input clock signal pulse SCLK_I corresponds with a leading edge of the first pulse of the second clock signal CLK_B. Notably, the second scan block 506-2 is not reset when CLK_B is driven high. The first pulse of CLK_B precedes that of the first pulse of CLK_A. Therefore, TAG1 remains high during the first pulse of CLK_B. With TAG1 high, $\overline{TAG1}$ is driven low which disables scan block 506-2 from being reset.

The first pulse of the first clock signal CLK_A is then provided, having a leading edge that corresponds with the falling edge of the first pulse of CLK_B. With scan block 506-1 enabled by TOKEN_1, the first pulse of CLK_A resets the tag bit of scan block 506-1, driving TAG_1 low to indicate the pass value of logic '0'.

The second pulse of the input clock signal SCLK_I is then provided. The second pulse is gated according to TAG2 for scan block 506-2. TAG2 is high, which drives $\overline{TAG2}$ low to disable the second token latch in the scan chain. With the second token latch disabled, control signal TOKEN_3 is not asserted and the final scan block group is not enabled. Therefore, the output of the final scan block 506-6 is driven low. Accordingly, the output AND gate will be driven low again gating the input clock signal pulse. Therefore the output clock signal SCLK_O does not contain a pulse corresponding to the second pulse of the input clock signal SCLK_I.

The falling edge of the second pulse of the input clock signal pulse SCLK_I corresponds with the leading edge of the second pulse of the second clock signal CLK_B. The second pulse of CLK_B resets the tag bit in scan block 506-2 to the pass value logic '0' from its initial state of logic '1'. Recall that TAG1 was driven low by resetting scan block 506-3 during the first pulse of CLK_A. Accordingly, $\overline{TAG1}$ is driven high during the second pulse of CLK_B. With $\overline{TAG1}$ high, scan block 506-2 is reset by the second pulse of CLK_B.

As TAG1 and TAG2 illustrate, the bit scan circuit of FIG. 4 is capable of correctly gating the input clock signal over two cycles according to the bit information associated with both scan blocks of the scan block group. Even though a single latch is used for each scan block, the loaded bit information from each scan block can be transferred for gating the input clock signal and then reset. By conditioning the reset of scan block 506-2 on the tag bit of scan block 506-1, and utilizing a reset pulse for scan block 506-2 that precedes that of scan block 506-1, a correct count of the bit information is made over two input clock cycles. The first tag bit has already been reset to logic 0 such that the second pulse of the first clock signal CLK_A has no effect on the first scan block 506-1. It is worth noting that control signals TOKEN_2 and TOKEN_3 are low when the second pulse of the second clock signal CLK_B is driven high. Thus, the second and third scan block groups are not enabled and no reset is caused for the first scan blocks in these scan block groups.

After the second pulse of CLK_B, both $\overline{TAG1}$ and $\overline{TAG2}$ are driven high which enables the first AND gate 574-1. The output of the first AND gate is driven high to enable the first token latch 572-1. In response to the output of the first AND gate going high, the first token latch asserts the control signal TOKEN_2. Control signal TOKEN_2 is driven high by the leading edge of the third pulse of SCLK_I.

Driving TOKEN_2 high enables scan blocks 506-2 and 506-3 for transfer. The third pulse of the input clock signal pulse SCLK_I is provided to the gating circuits. With the third scan block group enabled, the third pulse of the input clock signal is subjected to gating according to the tag bit of scan block 506-3. TAG3 is driven high by the corresponding tag bit which causes the input clock signal to be gated. $\overline{TAG3}$ is driven low which disables the final scan block group, thereby driving the scan chain output low to gate the input clock signal and the output AND gate. Therefore the output clock signal SCLK_O does not contain a pulse corresponding to the third pulse of the input clock signal SCLK_I. The third pulse of the first clock signal CLK_A has a leading edge that resets the tag bit of scan block 506-3, driving TAG3 low to indicate the pass value of logic '0'.

The fourth pulse of the input clock signal SCLK_I pulse is selectively gated according to TAG4 for scan block 506-4. TAG4 is low, which drives $\overline{TAG4}$ high. Recall that TAG3 was driven low during the third pulse of first clock signal CLK_A, thereby driving $\overline{TAG3}$ high. Accordingly, when $\overline{TAG4}$ is high, the second AND gate 574-2 in the scan chain is turned on to enable the second token latch. By enabling the third scan block group through the second token latch, scan block 506-4 does not cause the input clock signal SCLK_I to be gated. Instead, scan block 506-4 enables the next scan block in the chain to determine whether the fourth pulse will be gated.

In response to the output of the second AND gate going high, the second token latch asserts the control signal TOKEN_3. Token_3 is driven high by the leading edge of the fourth pulse of SCLK_I. Driving TOKEN_3 high enables scan blocks 506-5 and 506-6 for transfer. With the third scan block group enabled, the fourth pulse of the input clock signal is also subjected to gating according to the tag bit of scan block 506-5. The tag bit at scan block 506-5 is logic zero such that scan block 506-5 does not result in gating of the input clock signal.

With TAG5 low, $\overline{TAG5}$ is driven high. Driving $\overline{TAG5}$ high enables scan block 506-6 for transfer and reset. The tag bit of scan bit 506-6 is logic '1' such that TAG6 is high. With TAG6 high, $\overline{TAG6}$ is driven low. The low output of $\overline{TAG6}$ disables AND gate 602 thereby gating the input clock signal. Accordingly, the tag bit of the final scan block 506-6 causes the fourth pulse of the input clock signal to be gated. Therefore the output clock signal SCLK_O does not contain a pulse corresponding to the fourth pulse of the input clock signal SCLK_I.

The falling edge of the fourth pulse of the input clock signal pulse SCLK_I corresponds with the leading edge of the fourth pulse of the second clock signal CLK_B. The fourth pulse of CLK_B resets the tag bit in scan block 506-6 to the pass value logic '0' from its initial state of logic '1'. Recall that TAG5 is low, driving $\overline{TAG5}$ high to enable scan block 506-6 for reset. The assertion of the fourth pulse of CLK_B resets the tag bit of 506-6 to logic '0'. Resetting the tag bit of scan block 506-6 to the pass value drives TAG_6 low.

Each tag bit is set to the pass value following the fourth input clock signal pulse and corresponding pulses of clock signals CLK_A and CLK_B. Accordingly, each tag bit and the corresponding tag signals are low. The fifth pulse of the input clock signal SCLK_I is then provided to the gating circuits. With all tag bits at logic '0', the final scan block in the chain is enabled and its output is driven high by the tag bit. The output enables the output AND gate which allows the fifth pulse of the input clock signal to pass through. Accordingly, the gating circuits generate the output signal SCLK_O to include the fifth pulse from the input clock signal.

As illustrated in FIG. 5, four pulses are missing from the output clock signal SCLK_O relative to the input clock signal SCLK_I. The first four input clock signal pulses are gated according to the tag bits, TAG1, TAG2, TAG3 and TAG6. The control circuits receive the output clock signal SCLK_O and determine that four pulses are missing relative to the input clock signal pulse train. Accordingly, a counter or other means can be used to determine that four bits contained a logic '1' value during the scan operation.

Figure 6:
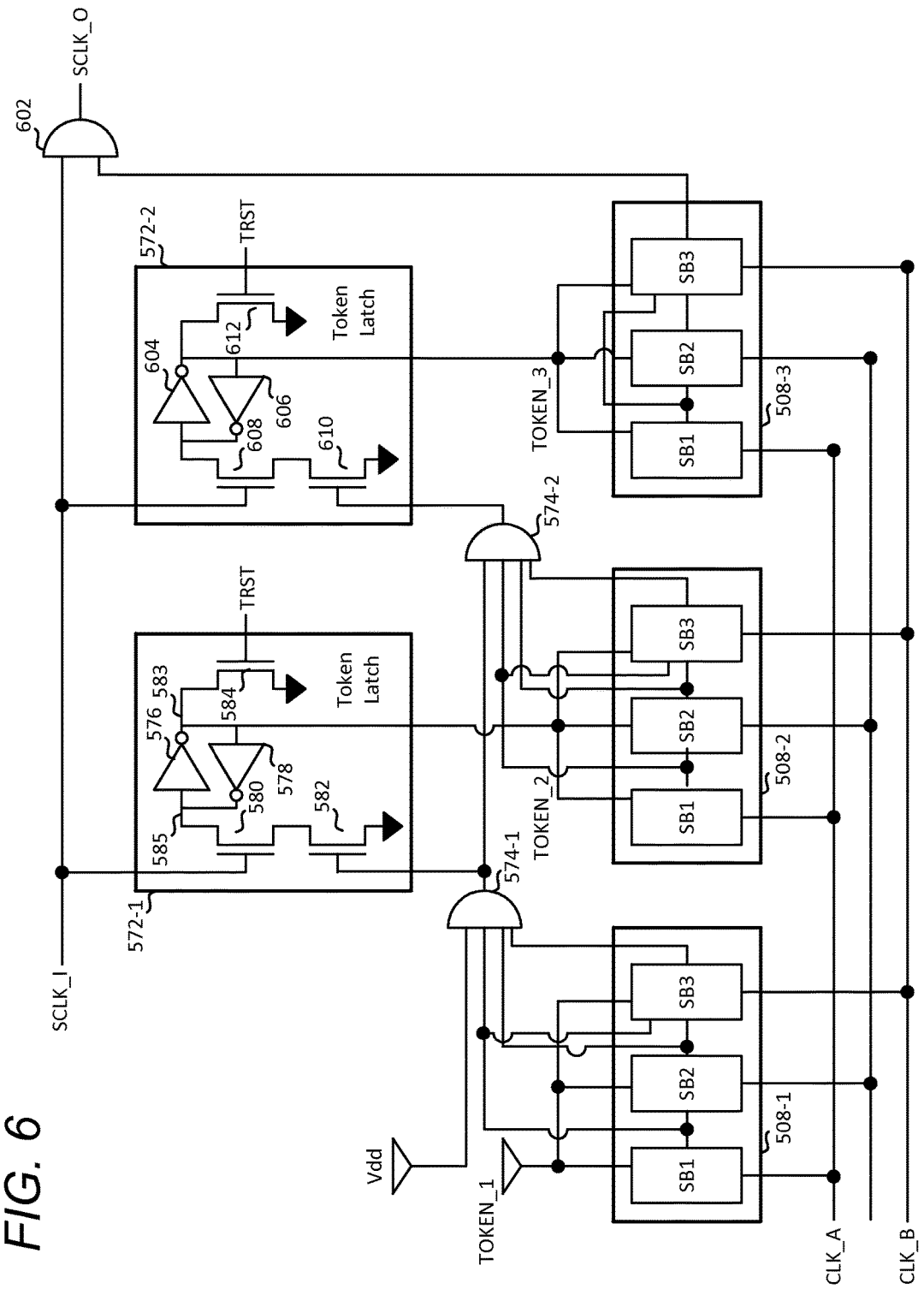
FIG. 6 is a block diagram of a bit scan circuit according to one embodiment.

FIG. 6 is a block diagram depicting an embodiment of a bit scan circuit according to one embodiment, illustrating that the number of clock signals and the number of scan blocks in each scan block group may vary. In this example, three independent clock signals are used to drive scan block groups including three scan blocks each. Scan blocks 506-1, 506-2, and 506-3 comprise a first scan block group 508-1; scan blocks 506-4, 506-5, and 506-6 comprise a second scan block group 508-2; and scan blocks 506-7, 506-8, and 506-9 comprise a third scan block group 508-3. The first scan blocks of each scan block group including scan block 506-1, 506-4 and 506-7 are connected to a first clock signal CLK_A. A second subset of scan blocks including scan blocks 506-2, 506-5 and 506-8 are coupled to a second clock signal CLK_B. A third subset of scan blocks including scan blocks 506-3, 506-6 and 506-9 are coupled to a third clock signal CLK_C.

As with FIG. 4, the input clock signal SCLK_I is connected to the first input of AND gate 602. The second input of AND gate 602 is coupled to the output of the final scan block 506-9 in the scan chain.

Each scan block group is enabled by a corresponding token signal as earlier described. In this example, the first scan block group 508-1 is enabled by a token signal TOKEN_1, the second scan block group 508-2 is enabled by signal TOKEN_2, and the third scan block group 508-3 is enabled by a control signal TOKEN_3.

Token latch 572-1 is enabled by AND gate 574-1 when scan blocks 506-1, 506-2, and 506-3 of scan block group 508-1 have tag bits in the pass state. Token latch 572-2 is enabled when scan blocks 506-4, 506-5, and 506-6 of scan block 508-2 have tag bits in the pass state, and the output of AND gate 574-2 is high.

Figure 7:
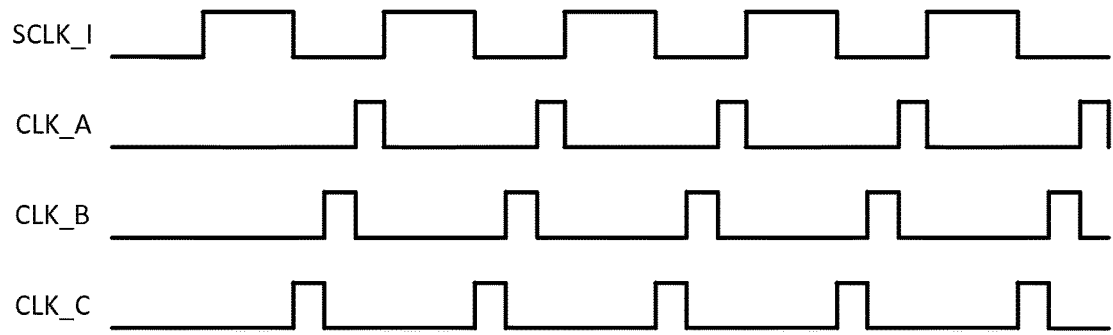
FIG. 7 is a timing diagram for the bit scan circuit of FIG. 6 according to one embodiment.

FIG. 7 is a timing diagram illustrating the input clock signal SCLK_I, the first clock signal CLK_A, the second clock signal CLK_B, and the third clock signal as described in FIG. 6. The first clock signal CLK_A includes a pulse train having a plurality of pulses, each having a pulse width that is one-third ('w/3') of that of the input clock signal. A second clock signal CLK_B and third clock signal CLK_C also include pulse trains having a plurality of pulses with the pulse width 'w/3'. Corresponding pulses from the first clock signal, the second clock signal, and the third clock signal are provided between the input clock signal pulses. Each pulse of the third clock signal precedes a corresponding pulse from the second clock signal. Each pulse of the second clock signal precedes a corresponding pulse from the first clock signal. For example, the first pulse from the third clock signal has a falling edge that corresponds with a leading edge of the first pulse of the second clock signal. The first pulse from the second clock signal has a falling edge that corresponds with a rising or leading edge of the first pulse of the first clock signal. The falling edge of an input clock signal pulse corresponds with a rising edge of a pulse from the third clock signal and a rising edge of the next input clock signal pulse corresponds with a falling edge of the a pulse from the first clock signal.

Figure 8:
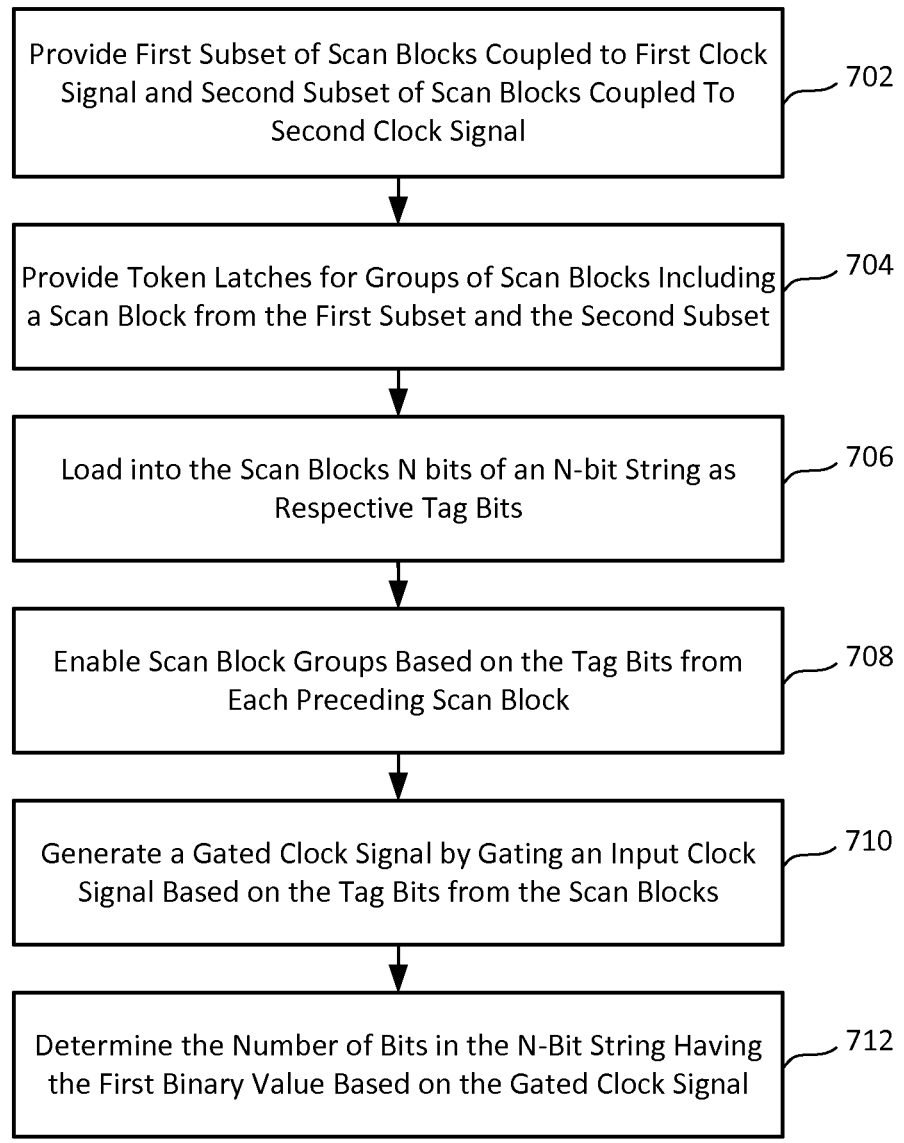
FIG. 8 is a flowchart describing a bit scan operation according to one embodiment.

FIG. 8 is a flowchart describing a process for performing a bit scan operation in accordance with one embodiment. At step 702, two or more subsets of scan blocks are provided in a scan chain for an N-bit string. The scan chain includes N scan blocks coupled serially using token latches to generate an output for gating an input clock signal. As specifically shown in FIG. 8, this includes providing a first subset of scan blocks coupled to a first clock signal and a second subset of scan blocks coupled to a second clock signal. The second clock signal includes a pulse train having pulses that precede corresponding pulses from a pulse train of the first clock signal. Each scan block includes a tag bit and acts as either a no-pass gate or a pass gate depending on the tag bit having a first binary value or a second binary value respectively.

At step 704, a plurality of token latches are provided for groups of scan blocks. The scan blocks are organized into scan block groups that each include a corresponding scan block from each subset. Each scan block within the group is connected together with the output of the first scan block in the group driving an input to enable the second scan block in the group for reset. If the groups include more than two scan blocks the output of the second scan block will drive a third scan block and so on.

At step 706, the N bits of an N-bit data string are loaded into the N scan blocks as respective tag bits. At step 708, each token latch enables or disables its corresponding scan block group based on the tags from each preceding scan block in the scan chain. A token latch will generate a token signal to enable the corresponding group of scan blocks if the output of the scan blocks from each preceding scan block group in the scan chain is the second binary value for example.

At step 710, the gating circuits generate a gated clock signal by gating an input clock signal in response to any one of the N scan blocks having a tag bit with the first binary value. The gating circuit may receive the output of the final scan block in the chain. The final scan block in the chain will only generate a signal that permits the gating circuit to pass the input clock signal when the tag bits of all scan blocks in the scan chain are set to the pass value.

At step 712, one or more control circuits determine a number of bits in the N-bit string having the first binary value based on a number of pulses missing from the gated clock signal after the tag bit of all of the N scan blocks is set to the second binary value.

Figure 9:
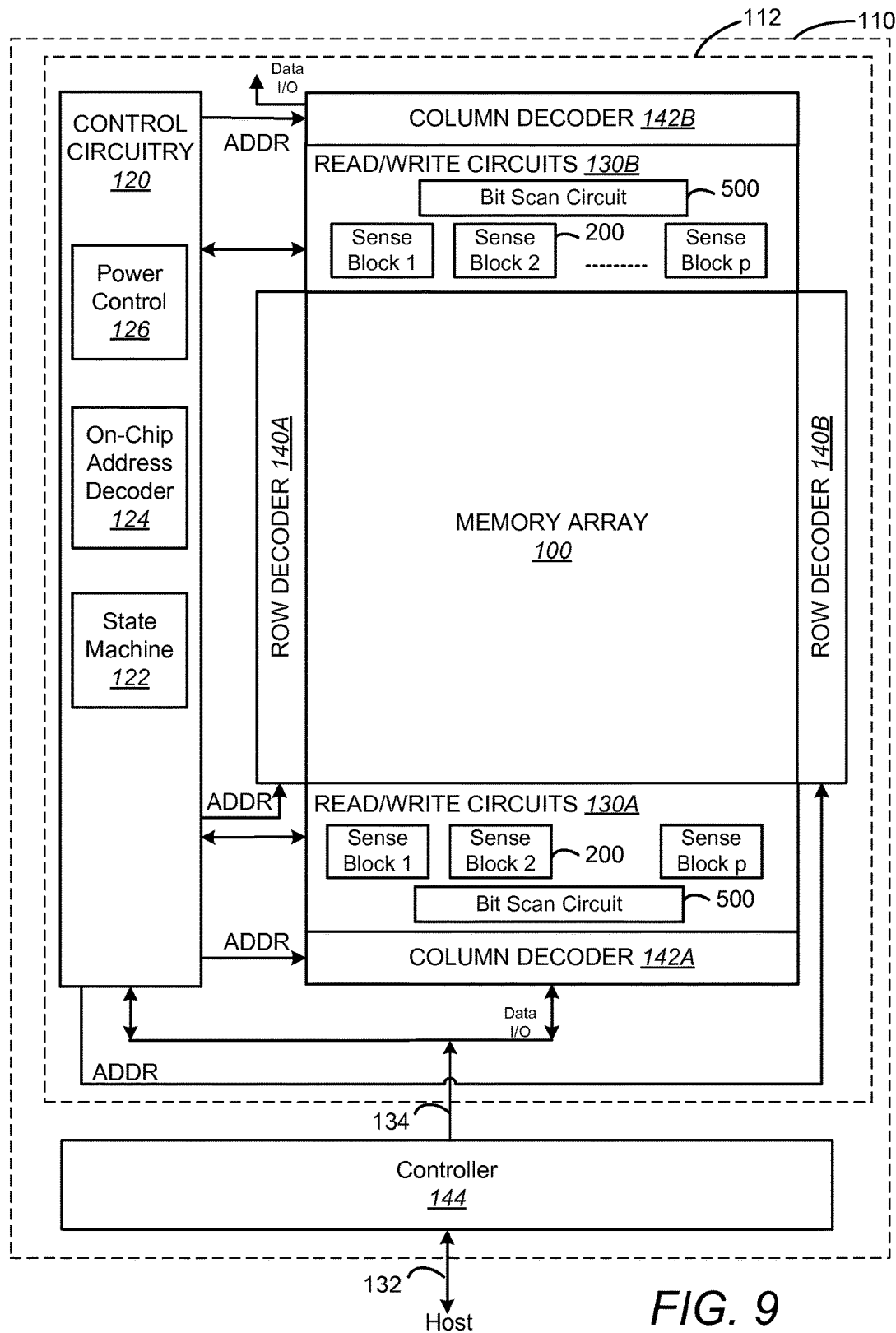
FIG. 9 is a block diagram of a non-volatile memory system according to one embodiment.

FIG. 9 is a block diagram describing an example of a memory device 110 in which embodiments of the present disclosure may be incorporated. FIG. 9 illustrates a memory device 110 having read/write circuits for reading and programming a page of memory cells in parallel. Memory device 110 may include one or more memory die or chips 112. Memory die 112 includes a two-dimensional or three-dimensional array of memory cells 100. Control circuitry 120 and read/write circuits 130A and 130B are provided. In the embodiment of FIG. 9, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. Read/write circuits 130A and 130B also include bit scan circuits 500 as earlier described.

The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations. Managing circuitry for memory array 100 can be considered to comprise one or more of the control circuitry 120, row decoders 140, column decoders 142, read/write circuits 130, or controller 144, for example.

Figure 10:
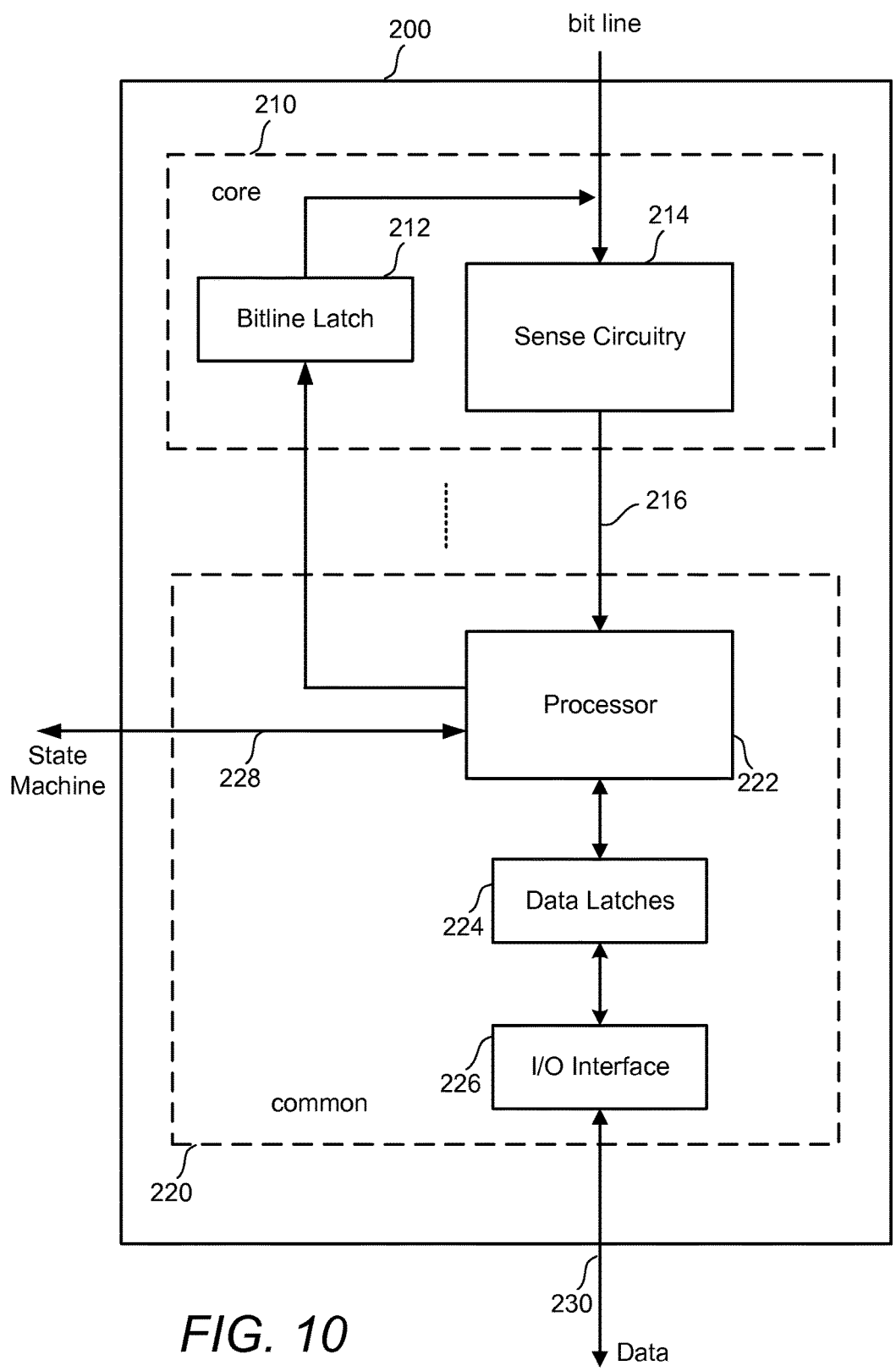
FIG. 10 is a block diagram of a sense block according to one embodiment.

FIG. 10 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., $V_{DD}$).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. During convention sensing, the state machine steps through the various predefined control gate voltages corresponding to the various memory states supported by the memory. The sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 11:
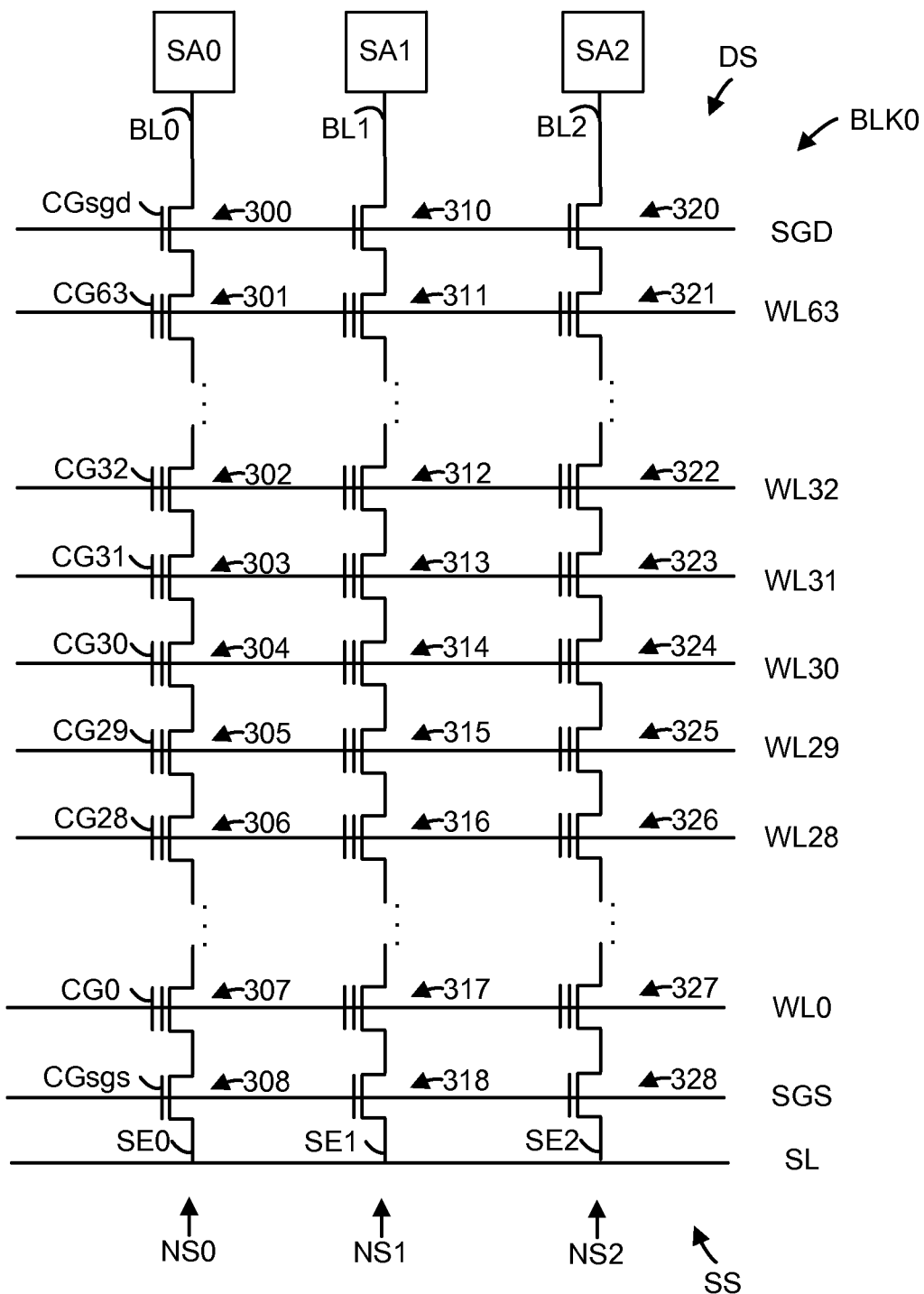
FIG. 11 is a block diagram of an example of three NAND strings in a block of non-volatile storage elements.

Typical flash memory architectures include NAND and NOR flash memories. NAND flash memory structures typically include many NAND strings. FIG. 11 depicts three NAND strings in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate drain (SGD) transistor, and the control gates of the SGD transistors are connected via a common SGD line. The NAND strings are connected at their other end to a select gate source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

NAND string NS0 includes storage elements 301, ..., 302-306, ..., 307 with respective control gates CG63, ... CG32-CG28, ... CG0, an SGS transistor 308 with a control gate CGsgs and a SGD transistor 300 with a control gate CGsgd. NAND string NS1 includes storage elements 311, ..., 312-316, ..., 317, an SGS transistor 318 and a SGD transistor 310. NAND string NS2 includes storage elements 321, ..., 322-326, ..., 327, an SGS transistor 328 and a SGD transistor 320. NAND strings NS0, NS2, ... are even numbered, and NAND strings NS1, NS3 (not shown), ... are odd numbered. Similarly, bit lines BL0, BL2, ... are even numbered, and the NAND strings BL1, BL3 (not shown), ... are odd numbered. The storage elements can store user data and/or non-user data.

FIGS. 12A-12B depict a three-dimensional NAND stacked non-volatile memory device including an array of alternating conductive and dielectric layers disposed above a substrate as may also be used in accordance with one embodiment. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 12A illustrates a TCAT (Terabit Cell Array Transistor) array 50a, and FIG. 12B illustrates a BiCS (Bit Cost Scalable) array 50b. TCAT array 50a includes a NAND string 52a disposed above a substrate 54a. NAND string 52a has a drain end 56a coupled via SGD 58a to a bit line 60a, and a source end 62a coupled via SGS 64a to a source line 66a. BiCS array 110b includes a NAND string 112b disposed above a substrate 114b. NAND string 52b has a drain end 56b coupled via SGD 58b to a bit line 60b, and a source end 62b coupled via SGS 64b to a source line 66b.

Select gates SGD 116a and SGS 120a, and SGD 16b and SGS 120b are implemented above substrates 114a and 114b, respectively. SGD 116a and SGS 120a, and SGD 116b and SGS 120b consume a significant amount of area. Other 3D NAND non-volatile memory devices may include select gate transistors (SGD or SGS) disposed in the substrate below the NAND strings. In particular, 3D NAND memory arrays may include buried word lines as selector devices of select gate transistors (SGD or SGS).

One approach to erasing in a 3D stacked non-volatile memory device is to generate gate induced drain leakage (GIDL) current to charge up the NAND string channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Accordingly, there has been described an apparatus including a plurality of scan block groups comprising a scan chain for a string of binary data. Each scan block group includes a first scan block having a tag bit and a second scan block having a tag bit. The first scan block of each scan block group is coupled to a first clock signal and the second scan block of each scan block group is coupled to a second clock signal. The apparatus includes a plurality of token latches. Each token latch is coupled to a corresponding scan block group and is configured to enable the corresponding scan block group in response to the tag bit of the first scan block having a pass value and the tag bit of the second scan block from each preceding scan block group in the scan chain having a pass value.

A method has been described that includes providing N scan blocks in a scan chain for an N-bit string and providing a plurality of token latches. Each scan block includes a tag bit and acts as either a no-pass gate or a pass gate depending on the tag bit having a first binary value or a second binary value respectively. The N scan blocks include a first subset of scan blocks coupled to a first clock signal and a second subset of scan blocks coupled to a second clock signal. The second clock signal includes a pulse train having pulses that precede corresponding pulses from a pulse train of the first clock signal. Each token latch is coupled to a corresponding group of scan blocks including a first scan block from the first subset and a second scan block from the second subset. The method includes loading into the N scan blocks respective ones of the N bits of the N-bit string as respective tag bits, enabling by each token latch a corresponding scan block group based on an output of the first scan block and an output of the second scan block from each preceding scan block group in the scan chain being the second binary value, generating a gated clock signal by gating an input clock signal in response to any one of the N scan blocks having a tag bit with the first binary value, and determining a number of bits in the N-bit string having the first binary value based on a number of pulses missing from the gated clock signal after all of the N scan blocks have a tag bit with the second binary value.

A system has been described that includes a first scan means for determining a binary value of a first bit and a second bit of an N-bit string and a second scan means for a determining a binary value of a third bit and a fourth bit of the N-bit string. The first scan means includes a first scan block having a tag bit associated with the first bit and a second scan block having a tag bit associated with the second bit. The second scan means includes a first scan block having a tag bit associated with the third bit and a second scan block having a tag bit associated with the fourth bit. The system includes a first latch means for enabling the first scan means in response to the tag bits of one or more preceding scan means in the bit scan circuit having a pass value, and a second latch means for enabling the second scan means in response to the tag bits of the first and second scan blocks of the first scan means having the pass value. The system includes a first clock means for resetting the first scan block of the first scan means and the second scan means, and a second clock means for resetting the second scan block of the first scan means and the second scan means. The first clock means includes a pulse train having a plurality of pulses and the second clock means includes a pulse train having a plurality of pulses that precede a corresponding pulse from the first clock means.

A system has been described that includes a plurality of latch circuits comprising a scan chain for an N-bit string of binary data. The plurality of latch circuits include a first subset of latch circuits coupled to a first clock signal and a second subset of latch circuits coupled to a second clock signal. The system includes a plurality of token latches. Each token latch is coupled to at least one latch circuit of the first subset and at least one latch circuit of the second subset. Each token latch is configured to enable a corresponding latch circuit of the first subset and a corresponding latch circuit of the second subset in response to the tag bit of each preceding latch circuit in the scan chain having a pass value. The system includes one or more gating circuits configured to generate a gated clock signal by gating an input clock signal in response to the tag bit of any one of the latch circuits having a no-pass value. The system includes one or more control circuits configured to determine a number of bits in the string having a first binary value based on a number of pulses missing from the gated clock signal after the tag bits for all of the plurality of latch circuits have the pass value.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a plurality of scan block groups comprising a scan chain for a string of binary data, wherein each scan block group includes a first scan block having a first tag bit and a second scan block having a second tag bit, the first scan block of each scan block group having a first input coupled to a first clock signal and the second scan block of each scan block group having a second input coupled to a second clock signal, the first scan block of each scan block group having an output coupled to a third input of the second scan block of the scan block group; and
a plurality of token latches, each token latch coupled to a corresponding scan block group and configured to provide a signal to enable the corresponding scan block group in response to the first tag bit of the first scan block and the second tag bit of the second scan block from each preceding scan block group in the scan chain having a pass value.

2. The apparatus of claim 1, wherein:
the first clock signal includes a pulse train having a plurality of pulses with a leading edge;
the second clock signal includes a pulse train having a plurality of pulses with a leading edge that precedes the leading edge of a corresponding pulse from the first clock signal; and
the output of the first scan block is based on the first tag bit of the first scan block.

3. The apparatus of claim 2, wherein:
each tag bit is configured to store a pass value or a no-pass value
when enabled by a corresponding token latch, the second scan block of a scan block group including a second tag bit with the no-pass value resets the second tag bit of the second scan block to the pass value in response to the leading edge of a second clock signal pulse if the first tag bit of the first scan block of the scan block group is the pass value; and
the second scan block of the scan block group maintains the second tag bit of the second scan block at the no-pass value in response to the leading edge of the second clock signal pulse if the first tag bit of the first scan block of the scan block group is the no-pass value.

4. The apparatus of claim 3, wherein:
the no-pass value corresponds to a first binary value and the pass value corresponds to a second binary value; and
when enabled by a corresponding token latch, the second scan block of a scan block group including a second tag bit with the second binary value generates an output signal including the first binary value.

5. The apparatus of claim 4, wherein when enabled by a corresponding token latch:
the first scan block of a scan block group including a first tag bit with the first binary value resets the first tag bit of the first scan block to the second binary value in response to a leading edge of a first clock signal pulse; and
the first scan block generates an output signal including the first binary value to enable the second scan block of the scan block group for reset during a next second clock signal pulse.

6. The apparatus of claim 5, wherein:
the output of the first scan block of each scan block group is a first output;
each token latch includes an input that is coupled to an output of a logic gate for the token latch, the logic gate for each token latch includes a first input coupled to the first output of the first scan block from an immediately preceding scan block group in the scan chain and a second input coupled to a second output of the second scan block from the immediately preceding scan block group.

7. The apparatus of claim 6, wherein:
a first scan block group of the scan chain includes a first scan block and a second scan block that are enabled without a token latch.

8. The apparatus of claim 1, wherein:
the input clock signal includes a pulse train having a plurality of pulses with a leading edge and a falling edge, the leading edge of the input clock signal corresponds with a falling edge of the plurality of pulses of the first clock signal and the falling edge of the input clock signal corresponds with a rising edge of the plurality of pulses of the second clock signal.

9. The apparatus of claim 1, wherein:
the output of the first scan block of each scan block group is a first output;
each scan block group includes a third scan block coupled to a third clock signal, wherein a second output of each second scan block is coupled to a third input of the third scan block of the corresponding scan block group.

10. The apparatus of claim 1, wherein:
the scan chain comprises a bit scan circuit; and
the bit scan circuit is communicatively coupled to a three-dimensional non-volatile memory array.

11. A method, comprising:
providing N scan blocks in a scan chain for an N-bit string, wherein each scan block includes a tag bit and acts as either a no-pass gate or a pass gate depending on the tag bit having a first binary value or a second binary value respectively, wherein the N scan blocks include a first subset of scan blocks coupled to a first clock signal and a second subset of scan blocks coupled to a second clock signal, wherein the second clock signal includes a pulse train having pulses that precede corresponding pulses from a pulse train of the first clock signal;

providing a plurality of select latches, wherein each select latch has an input coupled to an output of a scan block of the second subset from the preceding scan block group and has an output coupled to a corresponding group of scan blocks including a first scan block from the first subset and a second scan block from the second subset;

loading into the N scan blocks respective bits from the N bits of the N-bit string as respective tag bits;

generating by each select latch a signal to enable a corresponding scan block group based on an output of the first scan block and an output of the second scan block from each preceding scan block group in the scan chain being the second binary value;

generating a gated clock signal by gating an input clock signal in response to any one of the N scan blocks having a tag bit with the first binary value; and determining a number of bits in the N-bit string having the first binary value based on a number of pulses missing from the gated clock signal after all of the N scan blocks have a tag bit with the second binary value.

12. The method of claim 11, wherein for a second scan block of a scan block group acting as a no-pass gate and enabled by a corresponding select latch, the method further comprises:

resetting the second tag bit of the second scan block to the second binary value in response to a leading edge of a second clock signal pulse if the first tag bit of the first scan block of the scan block group is the second binary value; and maintaining the second tag bit of the second scan block at the first binary value in response to the leading edge of the second clock signal pulse if the first tag bit of the first scan block of the scan block group is the first binary value.

13. The method of claim 12, wherein for the second scan block of a scan block group acting as a pass gate and enabled by a corresponding select latch, the method further comprises:

generating an output signal including the first binary value.

14. The method of claim 13, wherein for the first scan block of a scan block group acting as a no-pass gate and enabled by a corresponding select latch, the method further comprises:

resetting the first tag bit of the first scan block to the second binary value in response to a leading edge of a first clock signal pulse; and generating an output signal including the first binary value to enable the second scan block of the scan block group for reset during a next second clock signal pulse.

15. A system, comprising:

a first scan means for determining a binary value of a first bit and a second bit of an N-bit string, the first scan means including a first scan block having a first tag bit associated with the first bit and a second scan block having a second tag bit associated with the second bit;

a first latch means for providing a latch signal to enable the first scan means in response to the first and second tag bits of one or more preceding scan means having a pass value, the first latch means having an input enabled by an output of the one or more preceding scan means;

a second scan means for a determining a binary value of a third bit and a fourth bit of the N-bit string, the second scan means including a first scan block having a first tag bit associated with the third bit and a second scan block having a second tag bit associated with the fourth bit;

a second latch means for providing a signal to enable the second scan means in response to the first and second tag bits of the first scan means having the pass value, the second latch means having an input enabled by an output of the first scan means;

a first clock means for resetting the first scan block of the first scan means and the second scan means, the first clock means including a pulse train having a plurality of pulses; and a second clock means for resetting the second scan block of the first scan means and the second scan means, the second clock means including a pulse train having a plurality of pulses that precede a corresponding pulse from the first clock means.

16. The system of claim 15, further comprising:

a first logic means for asserting a latch enable signal for the second latch means in response to the first tag bit of the first scan block and the second tag bit of the second scan block of the first scan means having the pass value, and an output of a preceding logic means for a preceding scan means indicating a pass condition.

17. The system of claim 16, wherein:

each tag bit is configured to have a first binary value to indicate a no-pass value or a second binary value to indicate the pass value; and an output of each scan block is configured to have the first binary value in response to a corresponding tag bit having the second binary value indicating the pass value.

18. The system of claim 17, wherein:

the preceding logic means includes a preceding AND gate that outputs the first binary value in response to the outputs of the preceding scan blocks having the first binary value; and the first logic means includes a first AND gate that outputs the first binary value to assert the latch enable signal for the second latch means in response to the output of the preceding AND gate, the output of the first scan block for the preceding scan means, and the output of the second scan block for the preceding scan means having the first binary value.

19. The system of claim 18, wherein the second scan means is a final scan means of a scan chain, the system further comprising:

one or more gate means for generating a gated clock signal by gating an input clock signal in response to the output of the second scan block having the second binary value; and one or more control means for determining a number of bits in the N-bit string having the first binary value based on a number of pulses missing from the gated clock signal after all of the plurality of scan blocks output the second binary value.

20. The system of claim 19, wherein when enabled by the first token latch and including a second tag bit with the first binary value:

the second scan block of the first scan means resets the second tag bit of the second scan block to the second binary value in response to a leading edge of a second clock signal pulse if the first tag bit of the first scan block of the first scan means is the second binary value; and the second scan block of the first scan means maintains the second tag bit of the second scan block at the first binary value in response to the leading edge of the second clock signal pulse if the first tag bit of the first scan block of the first scan means is the first binary value.

21. The system of claim 20, wherein when enabled by the first token latch and including a tag bit with the first binary value:

the first scan block of the first scan means resets the first tag bit of the first scan block to the second binary value in response to a leading edge of a first clock signal pulse; and the first scan block generates an output including the first binary value to enable the second scan block of the first scan means for reset during a next second clock signal pulse.

22. A system, comprising:

a plurality of latch circuits comprising a scan chain for an N-bit string of binary data, the plurality of latch circuits including a first subset of latch circuits coupled to a first clock signal and a second subset of latch circuits coupled to a second clock signal;

a plurality of token latches, wherein each token latch is coupled to at least one latch circuit of the first subset and at least one latch circuit of the second subset, wherein each token latch is configured to provide a signal to enable a corresponding latch circuit of the first subset and a corresponding latch circuit of the second subset in response to a tag bit of each preceding latch circuit in the scan chain having a pass value;

one or more gating circuits configured to generate a gated clock signal by gating an input clock signal in response to the tag bit of any one of the latch circuits having a no-pass value; and one or more control circuits configured to determine a number of bits in the string having a first binary value based on a number of pulses missing from the gated clock signal after the tag bits for all of the plurality of latch circuits have the pass value.

23. The system of claim 22, wherein:

the first clock signal includes a pulse train having a plurality of pulses with a leading edge;

the second clock signal includes a pulse train having a plurality of pulses with a leading edge that precedes the leading edge of a corresponding pulse from the first clock signal; and an output of the latch circuit of the first subset is coupled to an input of the corresponding latch circuit of the second subset, wherein the output of the latch circuit of the first subset is based on the tag bit of the latch circuit of the first subset.

24. The system of claim 23, wherein when enabled by a first token latch:

a first latch circuit of the first subset including a first tag bit with the first binary value resets the first tag bit of the first latch circuit to a second binary value in response to a leading edge of a first clock signal pulse; and the first latch circuit generates an output signal including the first binary value to enable a corresponding latch circuit of the second subset for reset during a next second clock signal pulse.

\* \* \* \* \*